US006255121B1

(12) United States Patent
Arita et al.

(10) Patent No.: US 6,255,121 B1
(45) Date of Patent: Jul. 3, 2001

(54) METHOD FOR FABRICATING FERROELECTRIC FIELD EFFECT TRANSISTOR HAVING AN INTERFACE INSULATOR LAYER FORMED BY A LIQUID PRECURSOR

(75) Inventors: Koji Arita, Colorado Springs, CO (US); Shinichiro Hayashi; Tatsuo Otsuki, both of Osaka (JP); Carlos A. Paz de Araujo, Colorado Springs, CO (US)

(73) Assignees: Symetrix Corporation, Colorado Springs, CO (US); Matsushita Electronics Corporation (JP)

( * ) Notice: Subject to any disclaimer, the term of this patent is extended or adjusted under 35 U.S.C. 154(b) by 0 days.

(21) Appl. No.: 09/258,489

(22) Filed: Feb. 26, 1999

(51) Int. Cl.⁷ .......................... H01L 21/00; H01L 21/336; H01L 21/31; H01L 21/469
(52) U.S. Cl. ........................ 438/3; 438/287; 438/785
(58) Field of Search ................................ 438/3, 287, 785

(56) References Cited

U.S. PATENT DOCUMENTS

| | | |
|---|---|---|
| 2,791,758 | 5/1957 | Looney . |
| 2,791,759 | 5/1957 | Brown . |
| 2,791,760 | 5/1957 | Ross . |
| 2,791,761 | 5/1957 | Morton . |
| 2,876,436 | 3/1959 | Anderson . |
| 5,468,684 | 11/1995 | Yoshimori et al. . |
| 5,508,226 | 4/1996 | Ito et al. . |
| 5,523,964 | 6/1996 | McMillan et al. . |
| 5,536,672 | 7/1996 | Miller et al. . |
| 5,559,733 | 9/1996 | McMillan et al. . |
| 5,576,564 | 11/1996 | Satoh et al. . |
| 5,728,603 | * 3/1998 | Emesh et al. .................... 437/235 |
| 5,736,759 | 4/1998 | Haushalter . |
| 5,744,374 | 4/1998 | Moon . |
| 5,894,064 | * 4/1999 | Hampden-Smith et al. ............ 438/3 |
| 5,980,983 | * 11/1999 | Gordon ............................ 427/226 |

FOREIGN PATENT DOCUMENTS 06048895    2/1994   (JP) .

OTHER PUBLICATIONS

Hirai et al., "Preparation of SrBi2Ta2O9 Film at Low Temperatures and Fabrication of a Metal/Ferroelectric/Insulator/Semiconductor Field Effect Transistor Using Al/SrBi2Ta2O9/CeO2/Si(100) Structures," Jpn. J. Appl. Phys., vol. 36 (No. 9B), p. 5908–5911 (Sep., 1997).

Glavee et al., "Low Temperature Preparation Of BaCeO3 And Ce0.75Zr0.25O2 Thin Films Using Sol–Gel Processing Techniques," Materials Research Bulletin, Elsevier Science Ltd. (USA), vol. 34 (No. 5), p. 817–825 (1999).

Xu et al., "Dielectric hysteresis from transverse electric fields in lead zirconate titanate thin films," Applied Physics Letters, American Institute of Physics, vol. 74 (No. 23), p. 3549–3551 (Jun., 1999).

Shu–Yau Wu, "A New Ferroelectric Memory Device, Metal–Ferroelectric–Semiconductor Transistor," IEEE Transactions On Electron Devices, vol. ED–21 (No. 8), p. 499–504 (Aug., 1974).

(List continued on next page.)

*Primary Examiner*—Olik Chaudhuri
*Assistant Examiner*—Shrinivas Rao
(74) *Attorney, Agent, or Firm*—Duft, Graziano & Forest, P.C.

(57) ABSTRACT

A method for forming an interface insulator layer in a ferroelectric FET memory, in which a liquid precursor is applied to a semiconductor substrate. Preferably, the liquid precursor is an enhanced metalorganic decomposition ("EMOD") precursor, applied using a liquid-source misted deposition technique. Preferably, the EMOD precursor solution applied to the substrate contains metal ethylhexanoates containing metal moieties in relative molar proportions for forming an interface insulator layer containing $ZrO_2$, $CeO_2$, $Y_2O_3$ or $(Ce_{1-x}Zr_x)O_2$, wherein $0 \leq x \leq 1$.

27 Claims, 6 Drawing Sheets

OTHER PUBLICATIONS

S.Y. Wu, "Memory Retention And Switching Behavior Of Metal–Ferroelectric–Semiconductor Transistors," Ferroelectrics, Gordon and Breach Science Publishers Ltd. (Great Britain), p. 379–383 (1976).

Scott et al., "Integrated Ferroelectrics," Condensed Matter News, vol. 1 (No. 3), p. 16–20 (1992).

McMillan et al., "Process Development and Integration of Non–Destructive Readout (NDRO) Ferroelectric Memory," Defense Nuclear Agency Technical Report, Contract No. DNA 001–90–C–0004, p. 7–13 (Sep., 1993).

Hirai et al., "Formation of Metal/Ferroelectric/Insulator/ Semiconductor Structure with a CeO2 Buffer Layer," Jpn. J. Appl. Phys., vol. 33 (Part 1, No. 9B), p. 5219–5221 (Sep., 1994).

Chen et al., "Modeling Of Metal–Ferroelectric–Semiconductor Field Effect Transistor Subthreshold Current," Integrated Ferroelectrics, Overseas Publishers Association (Amsterdam B.V.), p. 265–274 (1994).

Nakamura et al., "Preparation of Pb(Zr,Ti)O3 thin films on electrodes including IrO2," Appl. Phys. Lett., vol. 65 (No.12), p. 1522–1524 (Sep. 19, 1994).

Hirai et al., "Characterization of Metal/Ferroelectric/Insulator/Semiconductor Structure with CeO2 Buffer Layer," Jpn. J. Appl. Phys., vol. 34 (Part 1, No. 8A), p. 4163–4166 (Aug. 1995).

T. Nakamura, "FFRAM," Ferroelectric Thin Film Memory, p. 261–271 (1995).

Katoh et al., "Non–Volatile FCG (Ferroelectric–Capacitor and Transistor–Gate Connection) Memory Cell with Non–Destructive Read–Out Operation," 1996 Symposium on VLSI Technology Digest of Technical Papers, IEEE, p. 56–57 (1996).

Hirai et al., "Crystal and Electrical Characterizations of Epitaxial CexZr1–xO2 Buffer Layer for the Metal/Ferroelectric/Insulator/Semiconductor Field Effect Transistor," Jpn. J. Appl. Phys., vol. 35 (Part 1, No. 9B), p. 5150–5153 (Sep., 1996).

Kim et al., "Memory window of Pt/SrBi2Ta2O9/CeO2/ SiO2/Si structure for metal ferroelectric insulator semiconductor field effect transistor," Appl. Phys. Lett., American Institute of Physics, vol. 71 (No. 24), p. 3507–3509 (Dec. 15, 1997).

Shin et al., "A Proposal of Pt/SrBi2Ta2O9/CeO2/Si Structure for Non Destructive Read Out Memory Devices," Extended Abstracts of the 1997 International Conference on Solid State Devices and Materials, p. 32–33 (1997).

Tokumitsu et al., "Electrical Properties Of Ferroelectric–Capacitor–Gate Si MOS Transistors Using P(L)ZT Films," Integrated Ferroelectrics, Overseas Publishers Association (Amsterdam B.V.), p. 137–144 (1997).

Auciello et al., "The Physics of Ferroelectric Memories," Physics Today, American Institute of Physics, p. 22–27 (Jul., 1998).

* cited by examiner

METHOD FOR FABRICATING FERROELECTRIC FIELD EFFECT TRANSISTOR HAVING AN INTERFACE INSULATOR LAYER FORMED BY A LIQUID PRECURSOR

BACKGROUND OF THE INVENTION

1. Field of the Invention

This invention relates to ferroelectric field effect transistors, and more particularly to ferroelectric nondestructive read-out memories utilizing such transistors and methods of fabricating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. Destructive reading followed by rewriting generally requires operating a memory with two transistors and two capacitors ("2T-2C"), which reduces overall circuit density and efficiency, as well as increase manufacturing costs.

It has been postulated for at least 40 years, however, that it may be possible to design a nonvolatile, nondestructive read-out ("NDRO") memory in which the memory element is a single ferroelectric field effect transistor ("FET"), thereby reducing at least some of the complexity of conventional 2T-2C operation. See Shu-Yau Wu, "A New Ferroelectric Memory Device, Metal-Ferroelectric-Semiconductor Transistor", in *IEEE Transactions On Electron Devices*, pp. 499–504, August 1974; S. Y. Wu, "Memory Retention and Switching Behavior Of Metal-Ferroelectric-Semiconductor Transistors", in *Ferroelectrics*, Vol. 11, pp. 379–383, 1976; and J. R. Scott, C. A. Paz De Araujo, and L. D. McMillan, "Integrated Ferroelectrics", in *Condensed Matter News*, Vol. 1, No. 3, pp. 15–20, 1992. Because the ferroelectric memory effect measured in the early devices of Wu was only a temporary single state effect rather than a long-lived two state effect, it is now believed that this effect was a charge injection effect rather than an effect due to ferroelectric switching.

A structure well-known in the art is the so-called metal-ferroelectric-semiconductor FET ("MFS-FET"), in which typically a ferroelectric oxide is formed on the semiconductor substrate, and the metal gate electrode is located on the ferroelectric oxide. When a ferroelectric oxide thin film, such as PZT, is formed directly on a semiconductor substrate, such as silicon, high leakage current, low retention times and fatigue are common problems. It is commonly believed in the art that some of this is a result of a poor interface between ferroelectric oxides and silicon. The poor interface may be a result of incompatibility of crystalline ferroelectric oxides with the crystal lattices and thermal coefficients of silicon.

Also, when a thin film of ferroelectric oxide is in direct electrical connection with the gate oxide layer of the transistor gate, it is difficult to apply sufficient voltage to the ferroelectric thin film to switch its polarization. A ferroelectric thin film and a gate oxide may be viewed as two capacitors in series. The dielectric constant of the ferroelectric thin film (usually 100–1000) is much higher than the dielectric constant of typical gate oxides (usually about 3–5). As a result, most of the voltage drop occurs across the low dielectric constant material, and an extra high operational voltage is required to switch the polarization of the ferroelectric thin film. This can lead to electrical breakdown of the gate oxide and other materials in the circuit. Further, a high operational voltage in excess of 3–5 volts would render the device incompatible with conventional integrated circuit art.

To reduce interface problems, structures have been designed in which an insulating oxide layer, such as $CeO_2$ or $Y_2O_3$, is deposited by sputtering or electron-beam evaporation on the semiconductor substrate before depositing the ferroelectric layer and gate electrode. Such a structure is referred to in the art as a metal-ferroelectric-insulator-semiconductor FET ("MFIS-FET"). Recently, a MFIS-FET device has been reported that appears to show true ferroelectric memory behavior. See Tadahiko Hirai et al., "Formation of Metal/Ferroelectric/Insulator/Semiconductor Structure With A $CeO_2$ Buffer Layer", in *Japanese Journal of Applied Physics*, Vol. 33, Part I, No. 9B, pp. 5219–5222, September 1994; Tadahiko Hirai et al., "Characterization of Metal/Ferroelectric/Insulator/Semiconductor Structure With A $CeO_2$ Buffer Layer", in *Japanese Journal of Applied Physics*, Vol. 34, Part I, No. 8A, pp. 4163–4166, August 1995; Tadahiko Hirai et al., "Crystal and Electrical Characterizations of Epitaxial $Ce_xZr_{1-x}O_2$ Buffer Layer for the Metal/Ferroelectric/Insulator/Semiconductor Field Effect Transistor", in *Japanese Journal of Applied Physics*, Vol. 35, Part I, No. 9A, pp. 5150–5153, September 1996; Yong Tae Kim et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, Dec. 15, 1997, pp. 3507–3509; Dong Suk Shin et al., "A Proposal of $Pt/SrBi_2Ta_2O_9/CeO_2/Si$ Structure for Non Destructive Read Out Memory Devices", Extended Abstracts of 1997 Int'l Conference on Solid State Devices and Materials, p. 32; and U.S. Pat. No. 5,744,374, issued Apr. 28, 1998 to Jong Moon. It is believed that an insulator layer located on the silicon substrate between the substrate and the ferroelectric thin film avoids the problems caused by a ferroelectric-semiconductor interface.

The interface insulator layer of the prior art has been deposited using target-sputtering methods or electron-beam evaporation. Such methods are generally complex, and they do not provide flexibility and accurate control of chemical composition when depositing interface insulator layers.

EMOD processes are known for forming ferroelectric materials and $ABO_3$ type metal oxides. See, U.S. Pat. No. 5,514,822 issued May 7, 1996 to Scott et al. However, the EMOD processes described in the prior art require high annealing temperatures, and it was believed that these temperatures would give rise to significant thicknesses of oxides, that is, on the order of 100 nm, particularly of semiconductor oxides, that would lead to charge injection and the other problems discussed above. Moreover, the required extreme thinness of the films required for the interface insulator to be effective, i.e. 5 nanometers (nm) to 50 nm, had not previously been obtainable with EMOD processes. Because of these problems, and other unusual surface phenomena and operating conditions encountered in processes using EMOD solutions, it was previously believed that EMOD processes could not be utilized to form a metal oxide interface insulator layer in a ferroelectric FET memory device between the ferroelectric thin film and the semiconductor substrate.

SOLUTION

The invention solves the problems described above by providing a novel method of depositing an interface insulator layer in a ferroelectric FET memory device, and a new composition of material in an interface insulator layer.

The method of the invention is generally a liquid source deposition method. In particular, the inventive method includes the preparation of at least one metalorganic precursor solution suitable for application to an integrated circuit substrate to form a solid thin film comprising the chemical species of the desired interface insulator layer. Similar solutions, used in the prior art to form other types of integrated circuit layers, are referred to generally as "enhanced metalorganic decomposition" ("EMOD") solutions. A method using a liquid source, usually a homogeneous mixture of metal alkoxides or metal alkoxycarboxylates, allows precise control of each individual metal and thereby of the stoichiometry of the final composition. It also gives flexibility in the selection of materials. It is shown herein that a metal-ferroelectric-insulator-semiconductor ("MFIS") heterostructure fabricated using the method of the invention possesses clearly defined interfaces between the layers and ferroelectric properties suitable for successful operation in a nonvolatile NDRO ferroelectric FET memory device. It is also shown that the interface insulator thicknesses from 5 nanometers to 50 nanometers can readily be formed. Typical thicknesses formed and studied were 20 nm. The invention discloses, therefore, an EMOD liquid precursor solution that can be successfully applied to a semiconductor substrate to form an interface insulator layer between the ferroelectric thin film and the semiconductor substrate in an MFIS heterostructure of a ferroelectric FET memory or similar device.

In addition, the invention provides a novel composition of an insulator layer containing $ZrO_2$ as the insulating material, as well as an EMOD solution and method for fabricating a $ZrO_2$ insulator layer.

The invention not only provides an effective interface between the semiconductor and ferroelectric in a ferroelectric FET, but it also provides a process for making the interface layer that is completely compatible with the preferred process used to make the ferroelectric layer. Numerous other features, objects and advantages of the invention will become apparent from the following description when read in conjunction with the accompanying drawings.

DETAILED DESCRIPTION OF THE PREFERRED EMBODIMENT

1. Introduction

It should be understood that the FIGS. 1, 3, 4, 6 and 7 depicting sections of integrated circuit devices are not meant to be actual plan or cross-sectional views of any particular portion of an actual integrated circuit device. In the actual devices, the layers will not be as regular and the thicknesses may have different proportions. The figures instead show idealized representations which are employed only to more clearly and fully depict the structure and method of the invention than would otherwise be possible.

Figure 1:
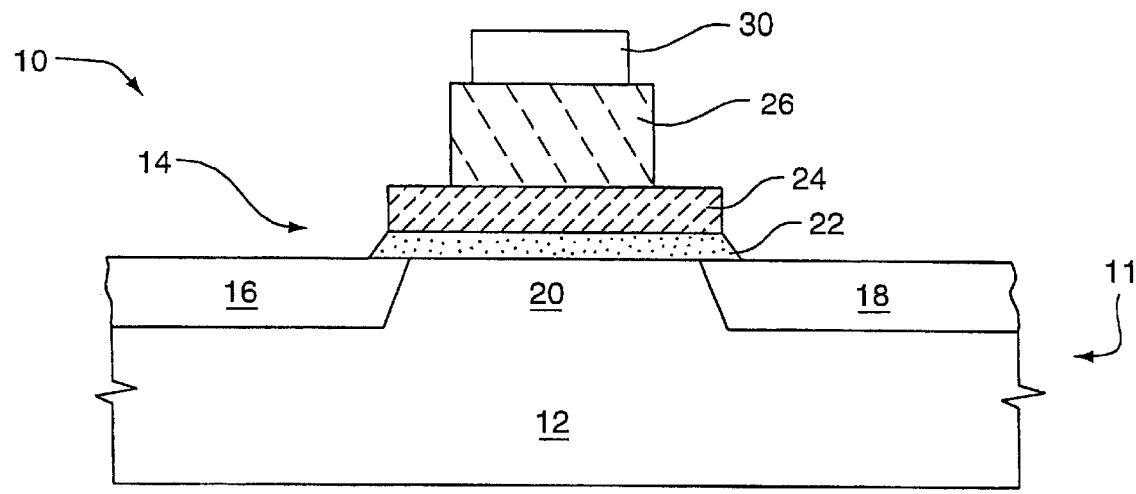
FIG. 1 shows a cross-sectional view of a portion of a ferroelectric FET memory that may be fabricated using a method according to the preferred embodiment of the invention.

FIG. 1 shows a cross-sectional view of a portion of a ferroelectric FET memory 10 as may be fabricated using a method according to the preferred embodiment of the invention. The ferroelectric FET memory 10 is formed on a wafer 11, comprising a standard semiconductor material 12, preferably a p-100 silicon material. A semiconductor substrate 14 comprises a highly doped source region 16 and a highly doped drain region 18, which are formed about a doped channel region 20. Doped source region 16, drain region 18 and channel region 20 are preferably n-type doped regions. Semiconductor substrate 14 typically also includes a gate oxide 22, located usually above channel region 20, but which can extend beyond channel region 20 to cover parts of source region 16, drain region 18 and other parts of substrate 12. Typically, gate oxide 22 is a natural oxide that is formed from the semiconductor material 12 during high temperature process steps. When the semiconductor material 12 is silicon, then gate oxide 22 comprises silicon dioxide. An interface insulator layer 24 according to the invention is formed on semiconductor substrate 14 above gate 20, usually on gate oxide 22. A ferroelectric thin film 26 is formed above interface insulator layer 24 and channel region 18, usually on interface insulator layer 24. Gate electrode 30 is formed above ferroelectric thin film 26, usually on ferroelectric thin film 26. Semiconductor substrate 14, including source region 16, drain region 18, channel region 20, and gate oxide 22, together with interface insulator layer 24, ferroelectric thin film 26 and gate electrode 30 form ferroelectric FET memory 10. Typically, memory 10 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

With respect to FIG. 1, the interface insulator layer 24 formed by the method of the invention typically comprises a dielectric metal oxide, such as $CeO_2$, $ZrO_2$, $Y_2O_3$, $(Ce_{1-x}Zr_x)O_2$, where $0 \leq x \leq 1$, preferably $(Ce_{0.1}Zr_{0.9})O_2$, but it may also be any dielectric material that is compatible with the other integrated circuit materials.

Ferroelectric thin film 26 preferably comprises a layered superlattice material, and most preferably, a layered superlattice material oxide. Nevertheless, the ferroelectric material contained in the ferroelectric thin film of the invention can include other metal oxides; for example, $ABO_3$-type perovskites. The ferroelectric material may also be a non-oxide metal compound, such as a metal fluoride, or a nonmetallic organic compound.

U.S. Pat. No. 5,519,234, issued May 21, 1996 to Araujo et al., incorporated herein by reference, discloses that layered superlattice compounds, such as strontium bismuth tantalate (SBT), have excellent properties in ferroelectric applications as compared to the best prior art materials and have high dielectric constants and low leakage currents.

The layered superlattice materials may be summarized generally under the formula:

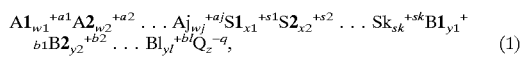
(1)

where A1, A2 ... Aj represent A-site elements in the perovskite-like structure, which may be elements such as strontium, calcium, barium, bismuth, lead, and others; S1, S2 ... Sk represent superlattice generator elements, which usually is bismuth, but can also be materials such as yttrium, scandium, lanthanum, antimony, chromium, thallium, and other elements with a valence of +3; B1, B2 ... Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements. For example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 ... wj all equal zero. If there is only one B-site element in the compound, then it is represented by the "B1" element, and y2 ... yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

(a1w1+a2w2 ... +ajwj)+(s1x1+s2x2 ... +skxk)+(b1y1+b2y2 ... +blyl)=qz. (2)

Formula (1) includes all three of the Smolenskii type compounds discussed in U.S. Pat. No. 5,519,234, issued May 21, 1996 to Araujo et al., which is hereby incorporated by reference as though fully incorporated herein. The layered superlattice materials do not include every material that can be fit into the formula (1), but only those which spontaneously form themselves into crystalline structures with distinct alternating layers. It has been shown that certain layered superlattice materials possess characteristics well-suited for conventional nonvolatile memory applications, such as high polarizability, high resistance to fatigue, low leakage current, low imprint, and suitable coercive voltage values.

Figure 2:
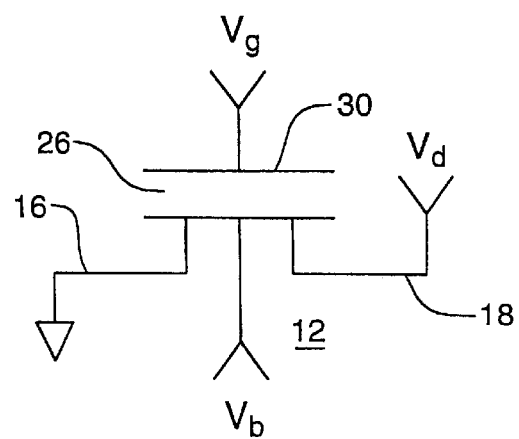
FIG. 2 shows the equivalent circuit for the memory of FIG. 1.

FIG. 2 shows the equivalent circuit for the preferred memory 10 of FIG. 1. In the preferred embodiment, source 16 is held at ground, and a bias voltage, Vb, used to select and deselect the cell is applied to the substrate 12. A drain bias voltage, Vd, is applied to drain 18 in the read process, and a gate bias voltage, Vg, is applied to gate electrode 30 to write to the cell.

Figure 3:
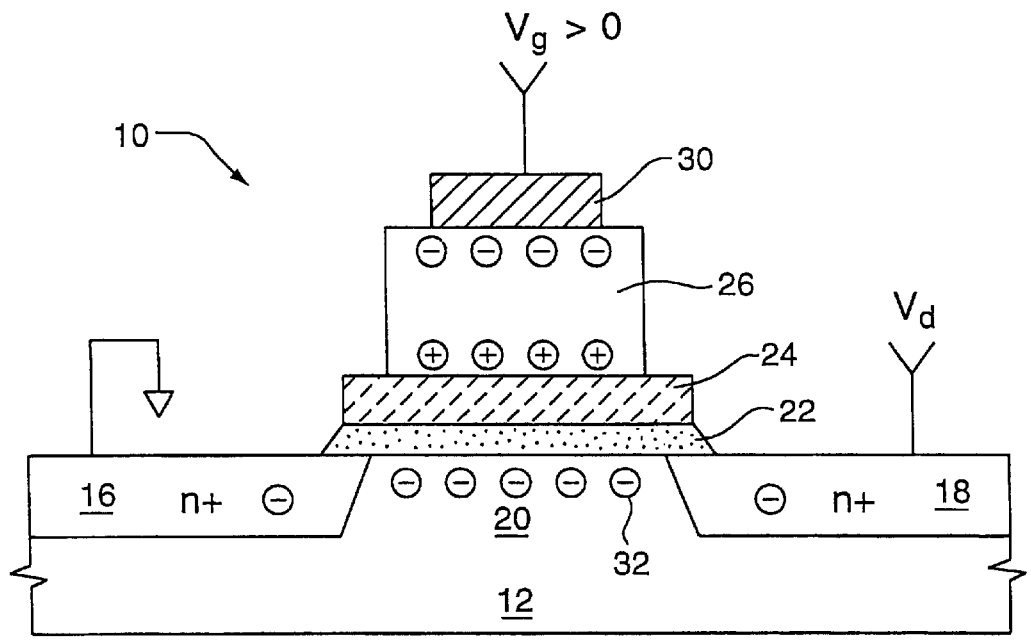
FIG. 3 illustrates the state of polarization of the ferroelectric thin film and the resulting electronic state of the channel region in the ferroelectric FET of FIG. 1 for an arbitrarily selected binary "1" state.
Figure 4:
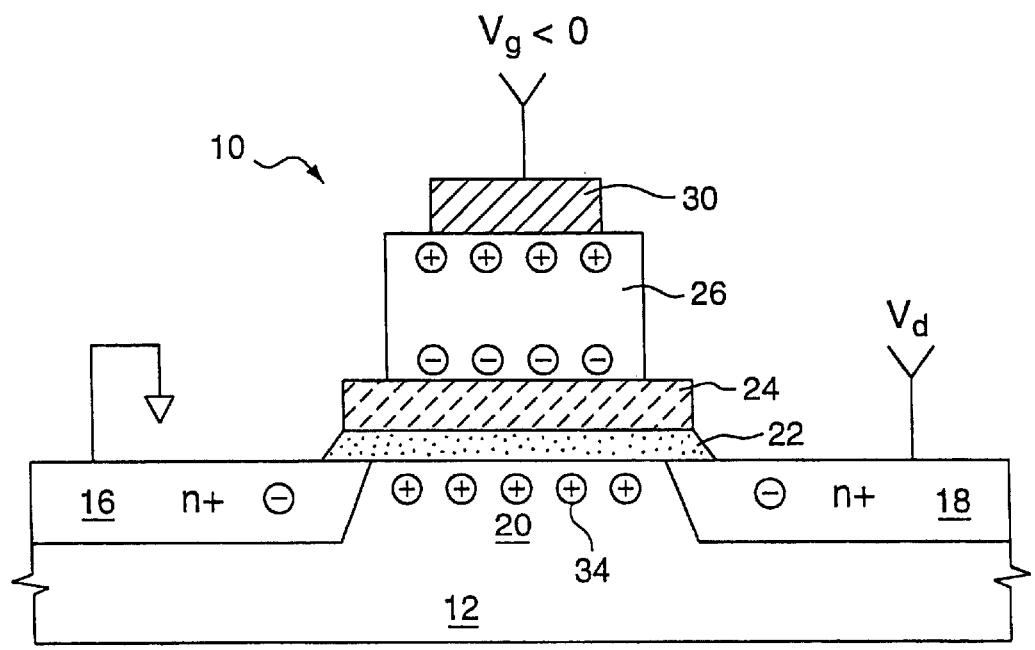
FIG. 4 illustrates the state of polarization of the ferroelectric thin film and the resulting electronic state of the channel region in the ferroelectric FET of FIG. 1 for an arbitrarily selected binary "0" state.

FIG. 3 illustrates the state of polarization of the ferroelectric thin film 26 and the resulting electronic state of channel region 20 for an arbitrarily selected binary "1" state, while FIG. 4 illustrates the state of polarization of the ferroelectric thin film 26 and the resulting state of channel region 20 for the "0" state. For the sake of clarity, ILD layers are not shown in these figures. In these figures, the circles in channel region 20 with minus signs, such as 32, represent electrons; the circles with plus signs, such as 34, represent positive holes. As shown in FIG. 3, if a positive write bias voltage, $V_g$, is applied to gate 30, then the resulting electric field exerted on ferroelectric thin film 26 causes ferroelectric thin film 20 to be polarized as shown, even after the voltage and field are no longer applied. The remanent polarization in ferroelectric thin film 26, as depicted in FIG. 3, exerts an electric field through interface insulator layer 24 and gate oxide 22 into channel region 20, attracting electrons into channel region 20, and thereby causing an increase of free electrons available for conduction of electric current. As a result, when drain voltage, $V_d$, is applied to drain region 18 in a read operation, a current sensor senses high current across channel region 20, and reads a binary "1" state. When, as depicted in FIG. 4, a negative $V_g$ is applied in the write operation, then the resulting remnant polarization in ferroelectric thin film 26 repels current-carrying electrons from, or attracts positive holes into, channel region 20, and the resulting low current is sensed as the binary "0" state when $V_d$ is applied in a read operation. The write bias voltage, $V_g$, and the read bias voltage, $V_d$, are typically in the range of 3–5 volts.

2. The Fabrication Process

The word "substrate" is often used ambiguously in the art. It can mean the underlying wafer 11 on which an integrated circuit is formed, as well as any object on which a thin film layer is deposited. In this disclosure, "substrate" shall mean the object to which the layer of interest is applied; for example, when we are talking about a ferroelectric thin film, such as thin film 26 in FIG. 1, the substrate includes the elements 12, 16, 18, 20 and 22 on which the ferroelectric thin film is formed. The term "semiconductor substrate" is more specific than substrate. As used herein, "semiconductor substrate 14" refers to those elements of the circuit having origins in the original semiconductor material of the starting wafer, such as from the p-100 crystalline silicon material of FIG. 1. Thus, in the example of the structure of FIG. 1, "semiconductor substrate 14" includes elements 12, 16, 18, 20 and 22.

The term "thin film" is used herein as it is used in the integrated circuit art. Generally, it means a film of less than a micron in thickness. The thin films disclosed herein are in all instances less than 0.5 microns in thickness. Preferably, the interface insulator layer 24 has a thickness in the range 5 nanometers (nm) to 50 nm. The ferroelectric thin film 26 may have a thickness in the range of 30 nm to 400 nm, preferably in the range 100 nm to 300 nm. These thin films of the integrated circuit art should not be confused with the layered capacitors of the macroscopic capacitor art which are formed by a wholly different process that is incompatible with the integrated circuit art.

In the art, the word "precursor" can mean a solution containing one metal which is mixed with other "precursors" to form intermediate precursors or final precursors, or it may refer to a final precursor mixture, that is, the solution to be applied to the substrate. In this disclosure, the first type of precursor is usually referred to as an "initial precursor" or designated specifically; for example, a "strontium precursor". The precursor as applied to the substrate is usually referred to as a "final precursor", "precursor mixture", or simply "precursor". In any case, the meaning is usually clear from the context.

The term "stoichiometric" herein may be applied to both a solid film of a material or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2Ta_2O_9$ are balanced stoichiometric formulae. In contrast, a precursor for strontium bismuth tantalate in which the molar proportions of strontium, bismuth, and tantalum are 0.9, 2.18, and 2.0, respectively, is represented herein by the unbalanced "stoichiometric" formula $Sr_{0.9}Bi_{2.18}Ta_2O_9$, since it contains excess bismuth and deficient strontium relative to the B-site element tantalum. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

Terms of orientation herein, such as "above", "top", "upper", "below", "bottom" and "lower", mean relative to the semiconductor substrate 14. That is, if a second element is "above" a first element, it means it is farther from the semiconductor substrate 14; and if it is "below" another element then it is closer to the semiconductor substrate 14 than the other element. Terms such as "above" and "below" do not, by themselves, signify direct contact. But terms such as "on" or "onto" do signify direct contact of one layer with an underlying layer.

The long dimension of semiconductor substrate 14 defines a plane that is considered to be a "horizontal" plane herein, and directions perpendicular to this plane are considered to be "vertical". The terms "lateral" or "laterally" refer to the direction of the flat plane of the semiconductor substrate 14, that is, parallel to the horizontal direction.

Figure 5:
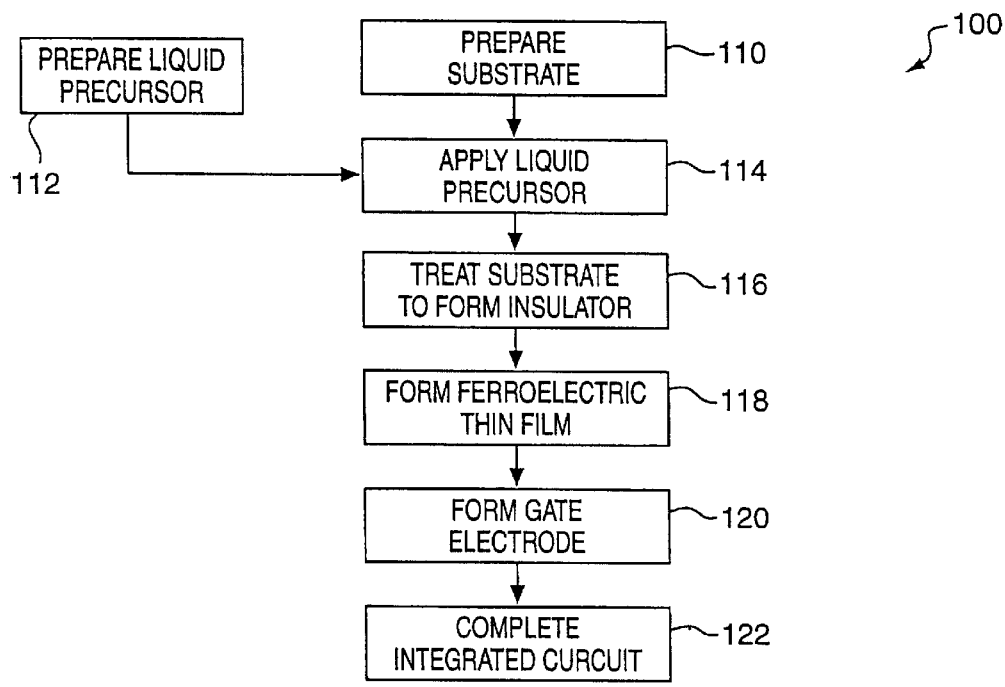
FIG. 5 is a flow chart showing the steps of a generalized liquid source deposition process for fabricating a ferroelectric FET memory having an interface insulating member in accordance with an embodiment of the invention.

FIG. 5 is a flow chart showing the steps of a generalized liquid source deposition process 100 for fabricating a ferroelectric FET memory in accordance with an embodiment of the invention. The fabrication methods disclosed here are discussed in relation to the structure of ferroelectric FET memory 10, depicted in FIG. 1. It is understood, however, that the useful feature of forming an interface insulator layer by applying a liquid precursor, preferably an EMOD precursor, to a semiconductor substrate to fabricate a ferroelectric FET can be applied in many variations of the generalized fabrication methods disclosed herein.

In substrate preparation steps 110, wafer 11 is cleaned to remove contaminants, preferably by dipping the wafer into $H_2SO_4$ for 30 minutes. Then, the wafer is dipped into 10:1 buffered HF solution for five minutes, which removes any natural oxide that may have formed on the wafer. A field oxide layer (not shown) is grown in a furnace, preferably to a thickness of 500 nanometers (nm). The source/drain regions 16 and 18 and the channel region 20 are then formed by a conventional doping method. This includes the usual photo resist, etching and strip steps for removal of the field oxide followed preferably by a phosphorous diffusion step. Preferably, the doping of channel region 20 is in the range of $2 \times 10^{15}$ to $10^{17}$ atoms/cm$^3$, and most preferably in the range $10^{16}$ to $10^{17}$ atoms/cm$^3$, which provides a resistance of about 1 ohm to 5 ohms. Preferably, the doping of the source/drain regions is in the range of $10^{19}$ to $10^{20}$ atoms/cm$^3$.

In step 112, a precursor for forming an interface insulator layer is prepared. Preferably, the precursor is an EMOD solution. Preferably, the EMOD solution is a 0.2 molar solution of zirconium 2-ethylhexanoate in n-octane, which is diluted to 0.1 molar concentration with n-butyl acetate solvent just prior to application step 114. The individual precursor is formed by interacting the metal or metals, for example, zirconium, or cerium and zirconium, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5-trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial precursors are usually made or bought in batches prior to their use; the final precursor mixtures are usually prepared immediately before application to the substrate. Final preparation steps typically include mixing, solvent exchange, and dilution.

In step 114, the liquid precursor for the interface insulator layer is applied to substrate 14 using any deposition process suitable for EMOD. Preferably, a liquid-source misted deposition method is used. A liquid-source chemical vapor deposition ("CVD") method may also be used. In the experiments described in detail below, a spin-on technique was used to spin on the EMOD precursor solution.

In step 116, the substrate is treated to form the interface insulator layer 24. Treating may comprise a process selected from the group including: exposing to vacuum, exposing to ultraviolet radiation, drying, heating, baking, rapid thermal processing, and annealing. Treatment in step 116 typically includes drying and annealing. Drying is typically performed for one minute at 160° C., then at 260° C. for four minutes. A furnace anneal, preferably in an oxygen atmosphere at 800° C. for 60 minutes, crystallizes the metal oxide compound in the interface insulator layer 24 of the preferred embodiment.

In step 118, the ferroelectric thin film 26 is prepared from initial precursors of the various components of the ferroelectric compound. The ferroelectric compound is typically a complex metal oxide and preferably a layered superlattice material; for example, strontium bismuth tantalate having a stoichiometric formula $SrBi_2Ta_2O_9$. Preferably, ferroelectric thin film 26 also is formed using an EMOD method. The individual precursors are formed by interacting each of the metals, for example, strontium, bismuth and tantalum, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial precursors are usually made or bought in batches prior to their use; the final precursor mixtures are usually prepared immediately before application to the substrate. Final preparation steps typically include mixing, solvent exchange, and dilution. In the experimental examples discussed below, a precursor for strontium bismuth tantalum niobate containing metal moieties in relative proportions corresponding to the stoichiometrically unbalanced formula $SrBi_{2.18}(Ta_{1.4}Nb_{0.6})O_{9.27}$ was used. The final precursor for the ferroelectric thin film may be applied using any liquid source deposition method suitable for EMOD solutions. Preferably, a misted deposition method is used. A CVD method may also be used. The misted deposition and CVD methods may start with a single final precursor, or a multisource method may be used such that individual precursors are mixed in the deposition apparatus just prior to deposition. In the example below, a two-coat liquid spin-on method was used. Forming the ferroelectric thin film includes treatment of the material deposited on the substrate. Treating may comprise one or more processes selected from the group including: exposing to vacuum, exposing to ultraviolet radiation, drying, heating, baking, rapid thermal processing, and annealing. Treatment in step 118 typically includes drying, rapid thermal processing ("RTP"), and annealing. Drying is typically performed for one minute at 160° C., then at 260° C. for four minutes. The RTP is typically done at 725° C. for 30 seconds, with a 100° C./sec ramping rate. A furnace anneal, preferably in an oxygen atmosphere at 800° C. for 60 minutes, crystallizes the ferroelectric compound.

In step 120, a gate electrode 30 is formed using conventional methods. Preferably, the gate electrode comprises platinum that is sputter-deposited to make a layer with 200 nm thickness; but it may be other metals or conductors also. Finally, in step 122, the integrated circuit device is completed, which includes forming interlayer dielectric layers, local interconnects, passivation layers and packaging.

EXAMPLE 1

Metal-ferroelectric-insulator-semiconductor ("MFIS") heterostructures were formed in accordance with the invention, but without the transistor elements (source, drain, gate). Also, metal-insulator-semiconductor ("MIS") heterostructures were formed in a similar manner. The two types of structures were studied using X-ray diffraction ("XRD"), Auger electron spectroscopy ("AES") and transmission electron microscopy ("TEM") prior to formation of the metal electrode. After formation of the metal electrode, the electronic properties of the resulting MFIS and MIS capacitors were measured.

Figure 6:
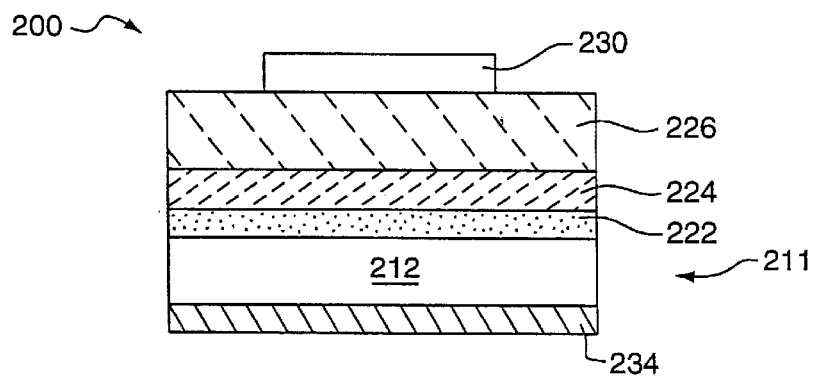
FIG. 6 is a schematic diagram of an MFIS heterostructure as formed in Example 1.

FIG. 6 is a schematic diagram of the MFIS heterostructure 200 formed in the experiment. To make the MFIS heterostructure 200, a prime grade (100)-oriented p-type silicon wafer 211 having a resistivity of 6–10 Ω-cm was cleaned by dipping in a $H_2O_2/NH_4OH/H_2O$ solution (volume ratio 1/1/8) at 70° C. for 30 minutes. The wafer was rinsed in deionized water, and dried. Then the wafer was dipped in 20:1 buffered HF solution for 20–30 seconds, rinsed in deionized water and dried. An EMOD method according to the invention was used to deposit a $ZrO_2$ interface insulator layer 224 on silicon substrate 212. A 0.2M n-octane based solution of zirconium 2-ethylhexanoate was diluted to 0.1M by adding n-butyl acetate. A single liquid coating of the 0.1M solution was applied using a spin-on technique, with a spin speed of 3000 rpm. The coating was dried at 150° C. for two minutes, then at 260° C. for four minutes. The solid coating was then furnace-annealed for 60 minutes at 800° C. in oxygen flowing at 5 l/m, with 10 minutes "push" and 10 minutes "pull". The $ZrO_2$-layer 224 had a thickness of about 19 nm. As a result of the fabrication steps, oxide layer 222 of $SiO_2$ having a thickness of 8 nm was formed from the silicon substrate 212. A thin film 226 of strontium bismuth tantalum niobate ("SBTN") was formed from an EMOD precursor solution having metal moieties in relative molar proportions corresponding to the unbalanced stoichiometric formula $SrBi_{2.18}Ta_{1.6}Nb_{0.4}O_{9.27}$. A 0.2 molar n-octane based precursor solution was diluted to a concentration of 0.1 molar by adding n-butyl acetate just prior to application. The precursor was applied onto the $ZrO_2$ layer using a two-coat spin-on technique, with a coater speed of 2000 rpm. The first coating was spun-on, then dried at 150° C. for two minutes and 260° C. for four minutes. The first coating was also furnace-annealed for 10 minutes at 800° C. in oxygen flowing at 5 l/m, with 10 minutes "push" and 10 minutes "pull". The second coating was applied and dried like the first coating. The resulting solid film was then annealed 60 minutes at 800° C. in oxygen flowing at 5 l/m, with 10 minutes "push" and 10 minutes "pull". On wafers studied by TEM, AEG or XRD, no further fabrication steps were performed. To measure the ferroelectric property of the MFIS structure, a platinum electrode 230 was formed on SBTN layer 226, and an aluminum layer 234 was applied to the bottom surface of the wafer 211. A platinum layer with a thickness of about 200 nm was sputter deposited on the SBTN layer. Then the platinum layer was ion-milled to form MFIS capacitors, followed by a furnace-anneal in oxygen for 30 minutes at 800° C. After that, the top of the wafer was covered with photoresist while the back side of the wafer was cleaned in a 20:1 buffered HF solution for about 2 minutes and rinsed in deionized water. Aluminum layer 234 having a thickness of 600 nm was sputter deposited onto the back of wafer 211 using a DC sputtering tool. After removal of the photoresist, the wafer was then furnace-annealed in nitrogen for 30 minutes at 450° C.

Figure 7:
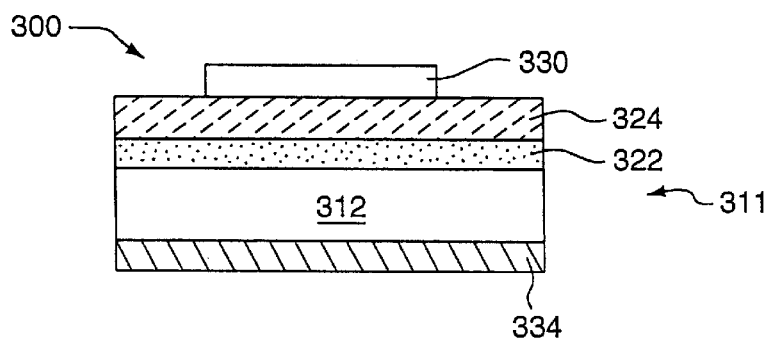
FIG. 7 is a schematic diagram of an MIS heterostructure as formed in Example 1.

FIG. 7 is a schematic diagram of the MIS heterostructure 300 studied in the experiment. A wafer 311 as described above for the MFIS structure was prepared and a $ZrO_2$ interface insulator layer 324 deposited on the silicon substrate 312, resulting in formation of a silicon dioxide layer 322. A platinum electrode 330 and aluminum layer 334 were formed as described above. The only essential difference in the fabrication and structure from the fabrication and structure described above for the MFIS structure is that no ferroelectric thin film was formed on $ZrO_2$ interface insulator layer 324.

Figure 8:
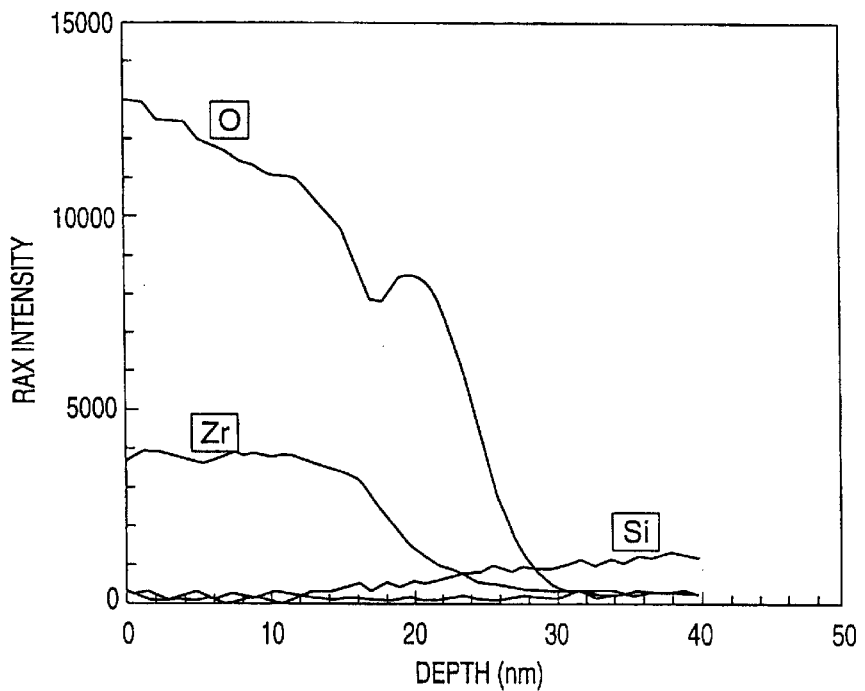
FIG. 8 depicts the AES depth profile of $ZrO_2$ on silicon substrate in a sample of Example 1.
Figure 9:
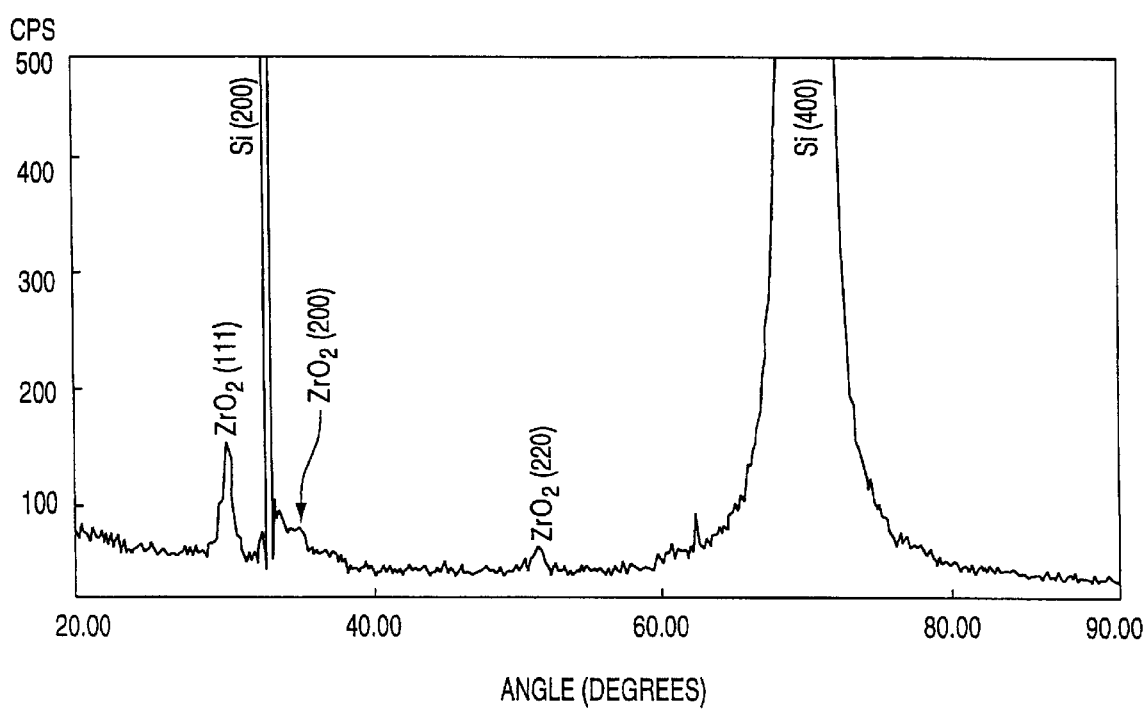
FIG. 9 shows the results of an XRD analysis of $ZrO_2$ on silicon substrate in a sample of Example 1.
Figure 10:
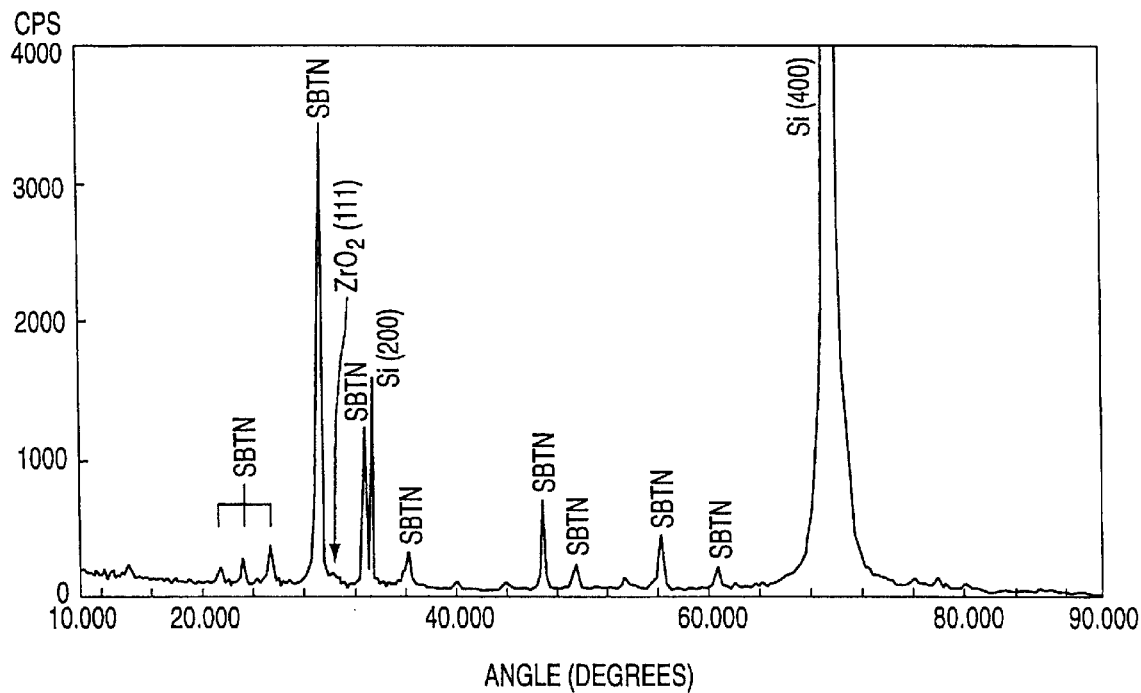
FIG. 10 shows the results of an XRD analysis of a SBTN/$ZrO_2$ structure on silicon substrate in a sample of Example 1.
Figure 11:
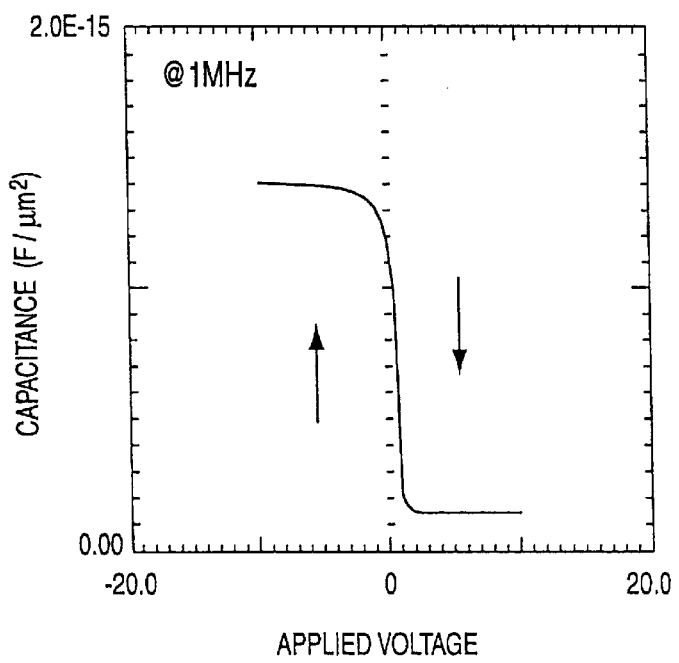
FIG. 11 is a graph of C–V measurements on a sample MIS capacitor of Example 1.
Figure 12:
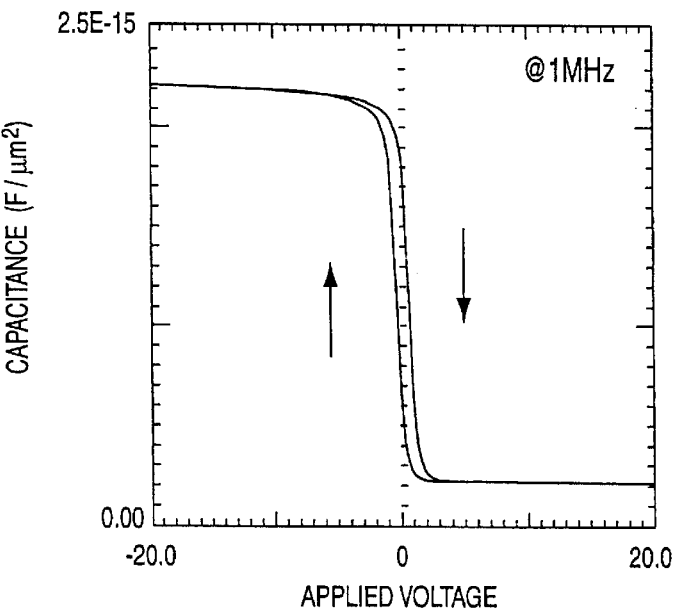
FIG. 12 is a graph of C–V measurements on a sample MFIS capacitor of Example 1.

AES, XRD and TEM studies of the MFIS and MIS structures described with reference to FIGS. 6 and 7 were performed. The graph of FIG. 8 depicts test results from an AES depth profile of $ZrO_2$ on silicon substrate performed on a sample wafer. It shows the $ZrO_2$ layer to be about 20 nm thick, with a clearly defined interface between $ZrO_2$ and silicon. The results of the TEM study of a sample wafer revealed the existence of a $SiO_2$ "gate oxide" layer between the $ZrO_2$ layer and the silicon substrate. The $SiO_2$ layer was about 8 nm thick; the $ZrO_2$ layer was 19 nm thick. The TEM also revealed clear interfaces between all layers, except for the interface between SBTN and $ZrO_2$. FIG. 9 shows the results of the XRD analysis of $ZrO_2$ on silicon substrate. FIG. 10 shows the results of the XRD analysis of a SBTN/$ZrO_2$ structure on silicon substrate. The graph of FIG. 10 shows the peaks characteristic of the crystalline structure of ferroelectric SBTN. Capacitance versus voltage measurements were made on the MIS and MFIS capacitors by applying a DC voltage with sweeps in the range ±10 volts at 1 MHZ. In the graph of FIG. 11 are plotted the results of the C–V measurements on a sample MIS capacitor. The curve shows no hysteresis effect. This indicates that the effect of charge injection or mobile ions was negligibly small. In the graph of FIG. 12 are plotted the results of the C–V measurements on a sample MFIS capacitor. In contrast to FIG. 11, the curve shows a distinct hysteresis effect, with a voltage window of about 0.8 volts. Since the results plotted in the graph of FIG. 11 indicate that there was no charge injection or ion mobility effect, the observed hysteresis is a genuine ferroelectric effect. The voltage window of 0.8 volts is comparable with voltage windows observed in MFIS capacitors of the prior art in which an interface insulator layer was deposited using sputtering techniques, or other processes, instead of an EMOD or other liquid source technique as used in the invention.

EXAMPLE 2

MIS heterostructures were formed in which the interface insulator layer was formed using a liquid precursor for cerium zirconium oxide containing metal moieties in relative molar proportions corresponding to the formula $Ce_{0.1}Zr_{0.9}O_2$. The EMOD solution was a 0.2 molar n-octane-based (1:9) mixture of cerium and zirconium 2-ethylhexanoates, diluted to 0.1 molar concentration with n-butyl acetate shortly before depositing. On each wafer, the interface insulator layer was deposited using a three-coat spin-on technique with a coater speed of 1500 rpm. After each of the three coatings, the wafer was dried at 160° C. for one minute, and 260° C. for four minutes. After the third drying step, the wafer was annealed in a furnace for 60 minutes at 800° C. in oxygen flowing at 5 l/m, with 10 minutes push, and 10 minutes pull. Additional processing steps for fabricating the MIS structure were the same process steps described for the MIS structure in Example 1.

Figure 13:
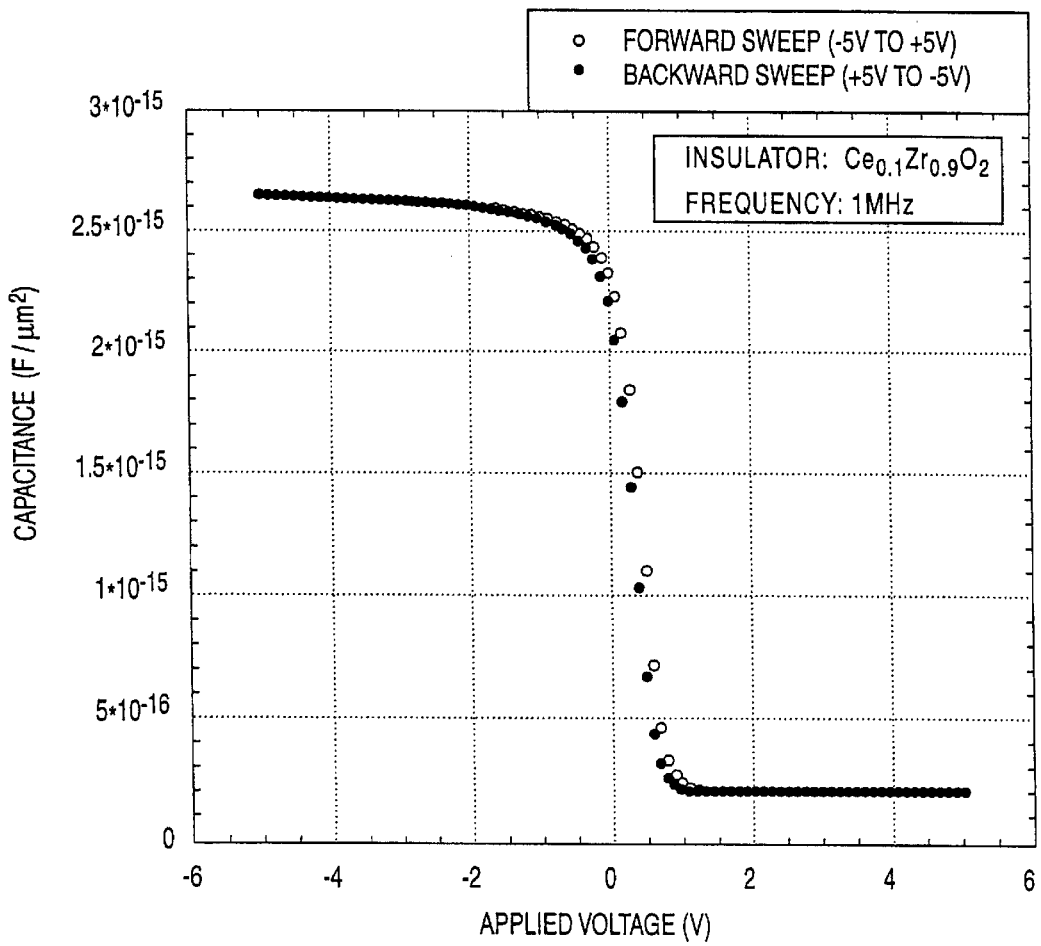
FIG. 13 is a graph of C–V measurements on a sample MIS capacitor of Example 2.

Cross-sectional TEM measurements of a sample wafer showed that the $Ce_{0.1}Zr_{0.9}O_2$ layer was about 36 nm thick. A $SiO_2$ layer between the $Ce_{0.1}Zr_{0.9}O_2$ layer and the silicon substrate was about 6 nm thick. The clear interfaces observed indicate that the EMOD technique of the invention may be used to deposit an interface insulator layer with good interface characteristics. Capacitance measurements of the MIS structure were performed by applying an AC signal of 141 mV amplitude and 1 MHZ frequency, while a DC electric field was swept in the range ±5 volts. As shown by the results for a sample wafer plotted on the graph of FIG. 13, no hysteresis was measured, indicating negligible charge injection or ion mobility effect. Based on the measured capacitance value and the thickness of the layer, the dielectric constant of the $Ce_{0.1}Zr_{0.9}O_2$ layer was about 20, which is significantly higher than the dielectric constant of pure $ZrO_2$ (about 10).

The results of Examples 1 and 2 confirm that the invention provides a method of using the flexibility and control of a liquid EMOD precursor to form an interface insulator layer on a semiconductor substrate in a ferroelectric FET. The interface insulator layer can be made to be very thin, less than 20 nm, or thicker. The results show a hysteresis effect and a voltage window large enough for operation in a nonvolatile NDRO memory. In spite of the relatively high process temperatures of the EMOD fabrication method, the structures fabricated with the method of the invention had $SiO_2$ layers with a thickness less than 10 nm. The results of Example 1 confirm the utility of the interface insulator layer comprising $ZrO_2$.

There has been described a method for fabricating in an integrated circuit a NDRO ferroelectric FET memory having an interface insulator layer. The method is especially useful because it uses a liquid EMOD precursor solution to deposit the interface insulator layer. The EMOD methods give flexibility and control over the chemical composition of deposited materials. Before the invention, it was not known that EMOD processes could successfully form a suitable interface insulator layer having good interface characteristics in the structure of a ferroelectric FET memory. It should be understood that the particular embodiments shown in the drawings and described within this specification are for purposes of example and should not be construed to limit the invention which will be described in the claims below. For example, the invention contemplates that the interface insulating film may comprise a wide range of materials that can be deposited using an EMOD technique. Similarly, the ferroelectric thin film in the ferroelectric FET of the invention may be made of any ferroelectric material.

Further, it is evident that those skilled in the art may now make numerous uses and modifications of the specific embodiments described, without departing from the inventive concepts. For example, now that an EMOD method to deposit an interface insulator layer in an integrated circuit has been identified as an important part of the process for fabricating NDRO ferroelectric FET memory devices, this method can be combined with other processes to provide variations on the method described. It is also evident that the steps recited may in some instances be performed in a different order; or equivalent structures and processes may be substituted for the structures and processes described. Consequently, the invention is to be construed as embracing each and every novel feature and novel combination of features present in and/or possessed by the fabrication processes, compositions, electronic devices, and electronic device manufacturing methods described.

What is claimed is:

1. A method of fabricating a ferroelectric FET comprising steps of:

preparing a semiconductor substrate;

forming an interface insulator layer, said interface insulator layer having a thickness of from 5 nanometers to 50 nanometers;

forming a ferroelectric thin film; and forming a gate electrode;

wherein said forming an interface insulator layer includes the steps of:

providing a liquid precursor for said interface insulator layer;

applying said liquid precursor to said substrate; and converting the liquid precursor to a metal compound to form said interface insulator layer.

2. A method of fabricating a ferroelectric FET as in claim 1, wherein said interface insulator layer comprises a metal oxide.

3. A method of fabricating a ferroelectric FET as in claim 1, wherein said interface insulator layer comprises an oxide selected from the group consisting of $ZrO_2$, $CeO_2$, $Y_2O_3$ and $(Ce_{1-x}Zr_x)O_2$, wherein $0 \leq x \leq 1$.

4. A method of fabricating a ferroelectric FET as in claim 1, wherein said liquid precursor is a precursor for a metal oxide selected from the group consisting of $ZrO_2$, $CeO_2$, $Y_2O_3$ and $(Ce_{1-x}Zr_x)O_2$, wherein $0 \leq x \leq 1$.

5. A method of fabricating a ferroelectric FET as in claim 1, wherein said liquid precursor is an EMOD precursor.

6. A method of fabricating a ferroelectric FET as in claim 1, wherein said liquid precursor comprises a metalorganic compound.

7. A method of fabricating a ferroelectric FET as in claim 6, wherein said metalorganic compound is selected from the group consisting of metal-alkoxycarboxylates, metal-carboxylates and metal-alkoxides.

8. A method of fabricating a ferroelectric FET as in claim 6, wherein said metalorganic compound is a metal ethylhexanoate.

9. A method of fabricating a ferroelectric FET as in claim 1, wherein said liquid precursor comprises a solvent.

10. A method of fabricating a ferroelectric FET as in claim 9, wherein said solvent is selected from the group consisting of: xylenes, octanes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol.

11. A method of fabricating a ferroelectric FET as in claim 1, wherein said interface insulator layer is formed between said semiconductor substrate and said ferroelectric thin film.

12. A method of fabricating a ferroelectric FET as in claim 1, wherein said interface insulator layer is formed on said semiconductor substrate.

13. A method of fabricating a ferroelectric FET as in claim 1, wherein said ferroelectric thin film is formed on said interface insulator layer.

14. A method of fabricating a ferroelectric FET as in claim 1, wherein said gate electrode is formed above said ferroelectric thin film.

15. A method of fabricating a ferroelectric FET as in claim 1, wherein said gate electrode is formed on said ferroelectric thin film.

16. A method of fabricating a ferroelectric FET as in claim 1, wherein said step of forming an interface insulator layer comprises the steps of: forming a mist from said liquid precursor, and depositing said mist on said substrate in a liquid coating.

17. A method of fabricating a ferroelectric FET as in claim 1, wherein said forming an interface insulator layer uses a chemical vapor deposition ("CVD") process including the steps of: placing said substrate in a deposition reactor; forming a gasified precursor from said liquid precursor; flowing said gasified precursor into said deposition reactor; and depositing a solid film from said gasified precursor onto said substrate.

18. A method of fabricating a ferroelectric FET as in claim 1, wherein said semiconductor substrate comprises a gate oxide layer.

19. A method of fabricating a ferroelectric FET as in claim 18, wherein said interface insulator layer is formed on said gate oxide layer.

20. A method as in claim 1, wherein said ferroelectric thin film comprises a ferroelectric metal oxide.

21. A method as in claim 20, wherein said ferroelectric metal oxide comprises a layered superlattice material.

22. A method as in claim 21, wherein said layered superlattice material comprises the metals strontium, bismuth and tantalum in relative molar proportions corresponding to the stoichiometric formula $SrBi_{2.18}Ta_2O_{9.27}$.

23. A method as in claim 21, wherein said ferroelectric layered superlattice material comprises the metals strontium, bismuth, tantalum and niobium in relative molar proportions corresponding to the stoichiometric formula $SrBi_{2.18}Ta_{1.4}Nb_{0.6}O_{9.27}$.

24. A method as in claim 1, wherein said step of treating comprises a process selected from the group consisting of: exposing to vacuum, exposing to ultraviolet radiation, drying, heating, baking, rapid thermal processing, and annealing.

25. A method as in claim 1 wherein said step of forming an interface insulator layer comprises forming a layer with a thickness of from 15 nanometers to 25 nanometers.

26. A method of fabricating a ferroelectric FET as in claim 1 wherein said interface insulator layer comprises $ZrO_2$.

27. A method of fabricating a ferroelectric FET as in claim 1 wherein said liquid precursor is a precursor for $ZrO_2$.

* * * * *